United States Patent
Lin et al.

(10) Patent No.: US 7,511,988 B2
(45) Date of Patent: Mar. 31, 2009

(54) STATIC NOISE-IMMUNE SRAM CELLS

(75) Inventors: Wesley Lin, Chu-Pai (TW); Fang-Shi Jordan Lai, Chia Yi (TW); Chia-Fu Lee, Hsinchu (TW); Sheng Chi Lin, Hsinchu (TW); Ping-Wei Wang, Hsin-Chu (TW); Chang-Yun Chang, Taipei (TW); Tang-Xuan Zhong, Kaohsiung (TW); Tsung-Lin Lee, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 127 days.

(21) Appl. No.: 11/483,819

(22) Filed: Jul. 10, 2006

(65) Prior Publication Data

US 2007/0268747 A1    Nov. 22, 2007

Related U.S. Application Data

(60) Provisional application No. 60/802,467, filed on May 22, 2006.

(51) Int. Cl.
*G11C 11/41* (2006.01)
*G11C 7/02* (2006.01)
*G11C 7/24* (2006.01)

(52) U.S. Cl. ............... 365/154; 365/206; 365/195; 365/202

(58) Field of Classification Search ............ 365/154, 365/206, 188, 174, 195, 202, 214, 230.05, 365/63, 72

See application file for complete search history.

(56) References Cited

U.S. PATENT DOCUMENTS

| | | | |
|---|---|---|---|
| 5,040,146 A | * | 8/1991 | Mattausch et al. ........ 365/154 |
| 6,172,907 B1 | * | 1/2001 | Jenne ..................... 365/185.18 |
| 6,215,694 B1 | * | 4/2001 | Li et al. .................. 365/156 |
| 6,285,580 B1 | * | 9/2001 | Phan et al. ............... 365/156 |
| 6,744,661 B1 | * | 6/2004 | Shubat .................... 365/156 |
| 6,970,374 B2 | | 11/2005 | Lin |
| 6,975,532 B1 | * | 12/2005 | Kosonocky et al. ........ 365/154 |
| 7,193,924 B2 | * | 3/2007 | Ramaraju et al. ......... 365/230.05 |
| 7,286,390 B2 | * | 10/2007 | Yokoyama ............... 365/154 |

* cited by examiner

*Primary Examiner*—J. H. Hur
(74) *Attorney, Agent, or Firm*—Slater & Matsil, L.L.P.

(57) ABSTRACT

A static random access memory (SRAM) cell includes a first load device, a first pull-down transistor, and a switch-box coupled between the first load device and the first pull-down transistor. The switch-box is configured to receive a switch control signal to turn off a first connection between the first load device and the first pull-down transistor during read operations of the SRAM cell and to turn on the first connection during write operations.

16 Claims, 16 Drawing Sheets

STATIC NOISE-IMMUNE SRAM CELLS

This application claims priority to Provisional Patent Application Ser. No. 60/802,467, filed May 22, 2006, and entitled, "Static Noise-Immune SRAM Cells," which application is hereby incorporated herein by reference.

TECHNICAL FIELD

This invention relates generally to semiconductor devices, and more particularly to memory cells, and even more particularly to the design and manufacturing methods of static random access memory cells.

BACKGROUND

Static random access memory (SRAM) is commonly used in integrated circuits. SRAM cells have the advantageous feature of holding data without requiring a refresh. FIG. 1 illustrates an exemplary circuit diagram of a typical six-transistor SRAM cell, which includes pass-gate transistors PG0 and PG1, pull-up transistors PU0 and PU1, and pull-down transistors PD0 and PD1. The gates of pass-gate transistors PG0 and PG1 are controlled by a wordline WL that determines whether the current SRAM cell is selected. A latch formed of pull-up transistors PU0 and PU1 and pull-down transistors PD0 and PD1 stores a state. The stored state can be read through bitlines BL and bitline-bar BLB, which has a reversed phase from bitline BL.

Prior to the starting time of the read operation, pass-gate transistors PG0 and PG1 are off since the wordline voltage is low, for example, at 0V. In order to read the stored data, both bitlines BL and BLB are pre-charged to VDD. Assuming the previously stored data is 1, which means that node C is at a high voltage and node CB is at a low voltage, when wordline WL is activated, pass-gate transistors PG0 and PG1 are turned on. The data "0" stored in the node CB will cause the discharge (through a current $I_{read}$) of bitline BLB to "0" through transistor PG1. On the other hand, the high voltage on node C will keep bitline BL at "1". The differential signals on bitlines BL and BLB will then be detected and read out through an output buffer.

With the scaling of integrated circuits, read and write margins of the SRAM cells are reduced. Reduced read and write margins may cause errors in respective read and write operations due to static noises. The read noise induced on node CB may be high enough to cause the state of the SRAM cell to flip over, and thus the content of the SRAM cell is reversed. FIG. 2 illustrates simulated voltages on nodes C and CB during a read operation where no flip over has occurred. It is noted that voltages on nodes C and CB have glitches during the read operation. The voltages on nodes C and CB then return to the stored values. FIG. 3 illustrates simulated voltages on nodes C and CB during an erroneous read operation. It is noted that voltages on nodes C and CB are flipped over during the read operation. The results shown in FIG. 3 are typically caused by a read margin lower than the static noise. Other factors causing this type of error may include, for example, reduced VDD voltage and high threshold-voltage mismatch between pull-up transistors and pull-down transistors.

Accordingly, a new SRAM cell that is immune to the errors caused by static noise is needed.

SUMMARY OF THE INVENTION

In accordance with one aspect of the present invention, a static random access memory (SRAM) cell includes a first load device, a first pull-down transistor, and a switch-box coupled between the first load device and the first pull-down transistor. The switch-box is configured to receive a switch control signal to turn off a first connection between the first load device and the first pull-down transistor during read operations of the SRAM cell and to turn on the first connection during write operations.

In accordance with another aspect of the present invention, an array of SRAM cells is arranged in a plurality of rows and a plurality of columns, wherein each of the SRAM cells comprises a load device, a pull-down transistor, and a switch-box coupled between the load device and the pull-down transistor. The switch-box is configured to receive a switch control signal to turn off a connection between the first load device and the first pull-down transistor during read operations of the SRAM cell and to turn on the connection during write operations of the SRAM cell. The SRAM array further includes a plurality of wordlines connected to the rows of SRAM cells of the array with a wordline connected to SRAM cells in a same row, a plurality of bitlines connected to the columns of SRAM cells of the array with a bitline connected to SRAM cells in a same column, and a plurality of switch control lines connected to switch-boxes of the SRAM cells.

In accordance with yet another aspect of the present invention, a method for operating an SRAM cell includes applying a read signal to a wordline, applying a switch-box control signal to a switch-box in order to disconnect a load device and a pull-down transistor during read operations of the SRAM cell, and turning on the switch-box to connect the load device and the pull-down transistor during write operations of the SRAM cell.

In accordance with yet another aspect of the present invention, a method of operating an SRAM array includes forming an array of SRAM cells arranged in a plurality of rows and a plurality of columns, wherein each of the SRAM cells comprises a load device, a pull-down transistor, and a switch-box coupled between the load device and the pull-down transistor. The switch-box is configured to receive a switch control signal to turn off a connection between the first load device and the first pull-down transistor during read operations of the SRAM cell and to turn on the connection during write operations of the SRAM cell. The method further includes connecting a plurality of wordlines to the rows of SRAM cells of the array with a wordline connected to SRAM cells in a same row, connecting a plurality of bitlines to the columns of SRAM cells of the array with a bitline connected to SRAM cells in a same column, connecting a switch control circuit to switch-boxes of the SRAM cells in the SRAM array through a plurality of switch control lines, and turning off a switch-box of an SRAM cell when a read operation is performed on the SRAM cell.

The preferred embodiments of the present invention are immune to static noise.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
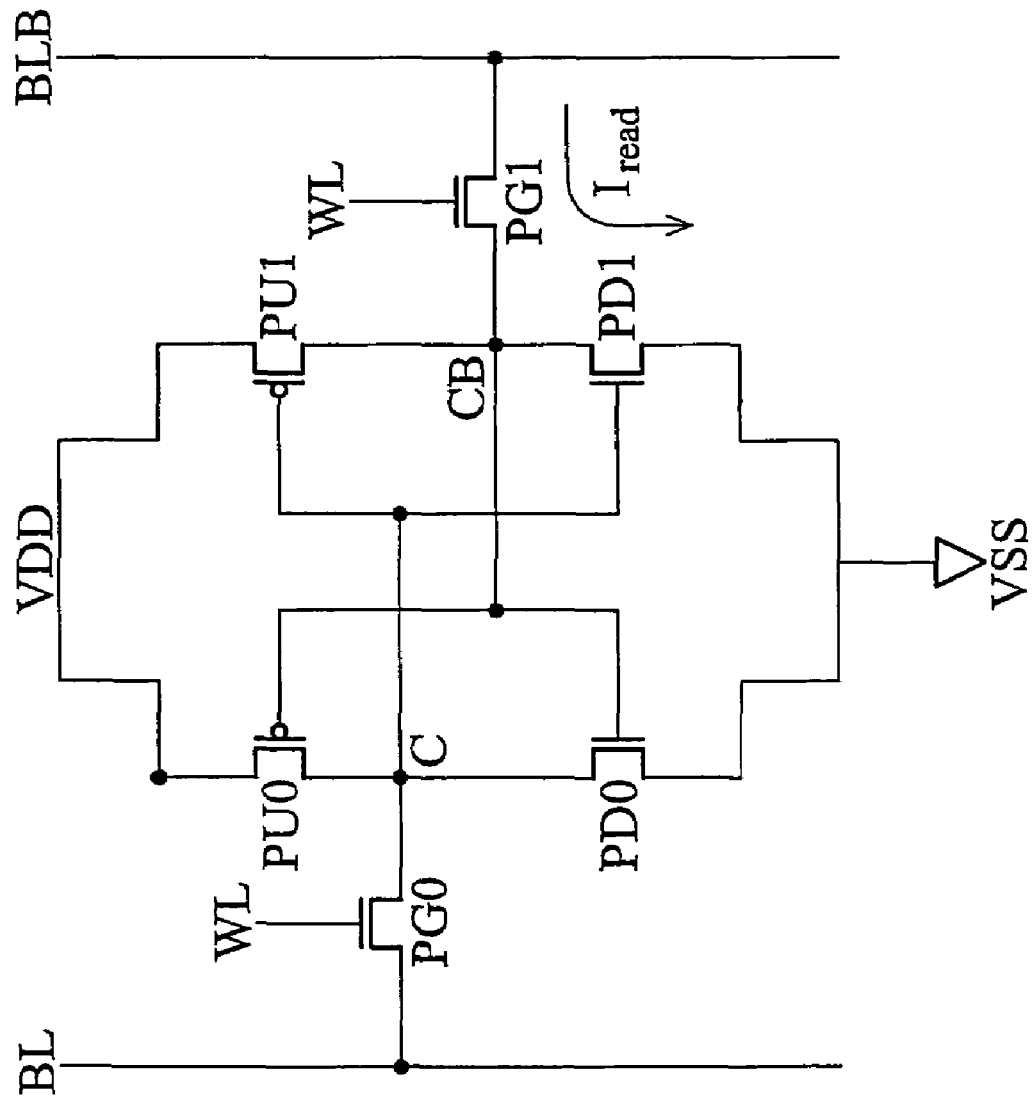
FIG. 1 illustrates a circuit diagram of a conventional six-transistor static random access memory (SRAM) cell.
Figure 2:
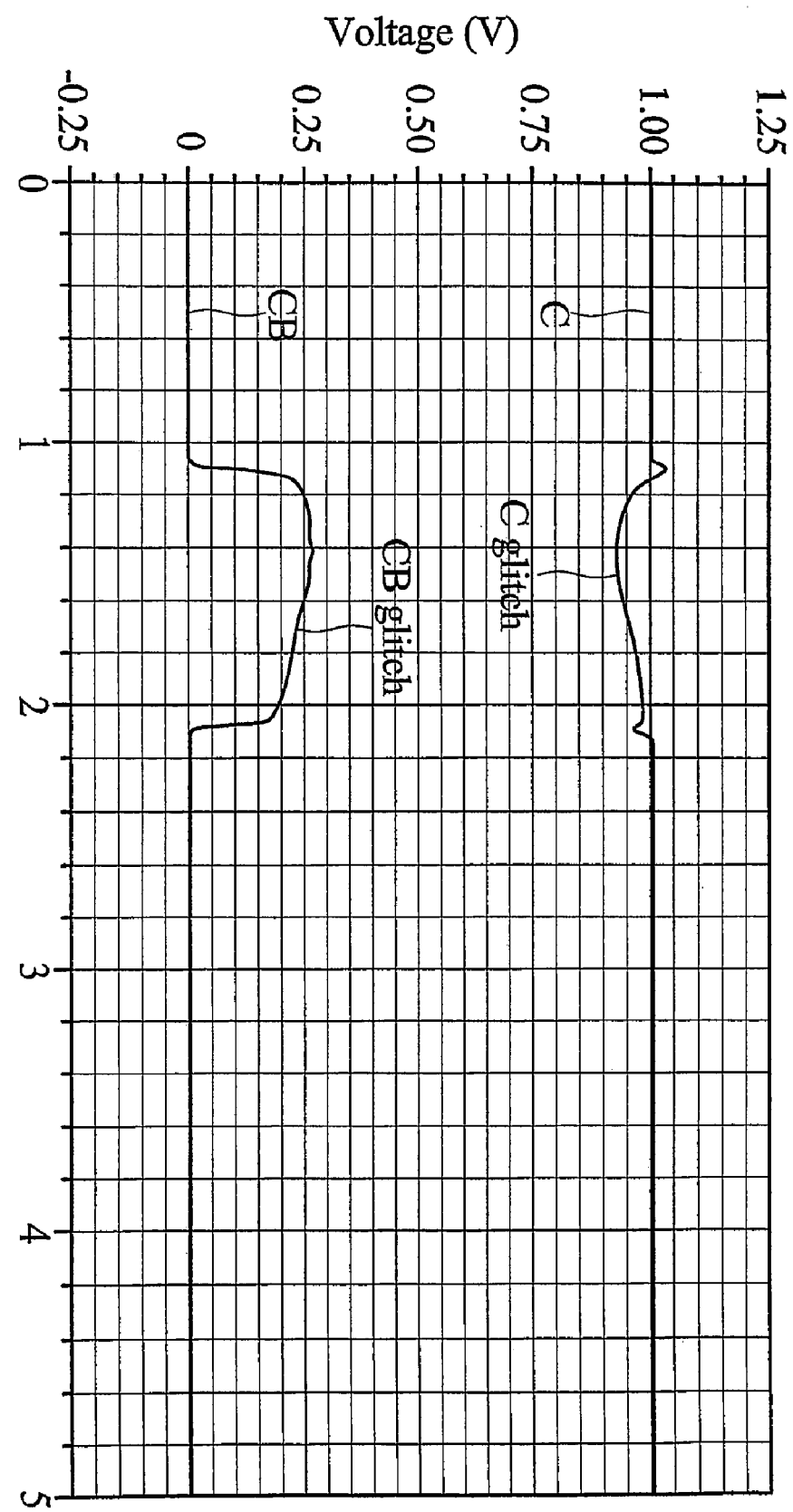
FIG. 2 illustrates simulated voltages on nodes of a conventional SRAM cell during a typical read operation.
Figure 3:
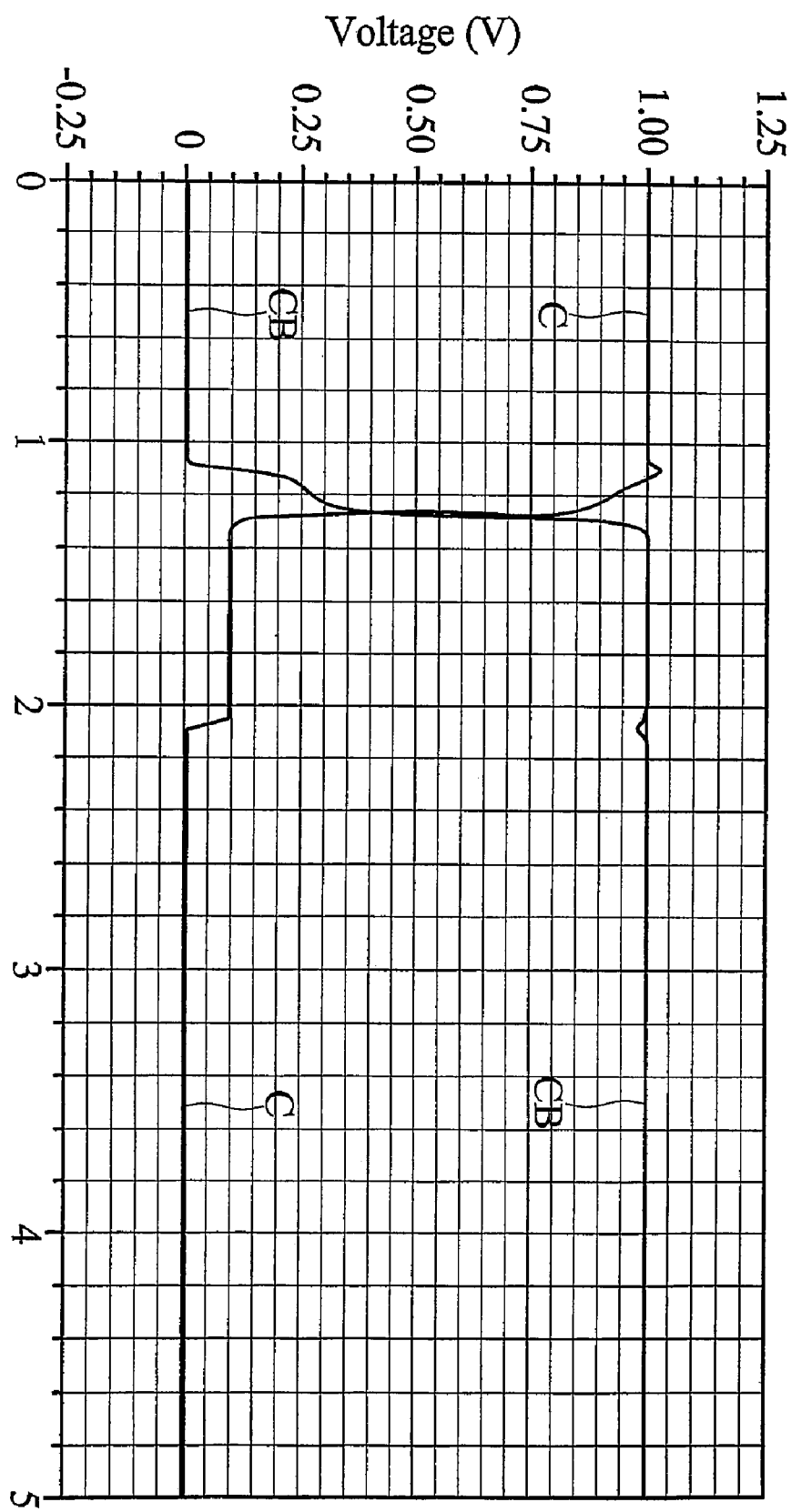
FIG. 3 illustrates simulated voltages on nodes of a conventional SRAM cell during an erroneous read operation.
Figure 4:
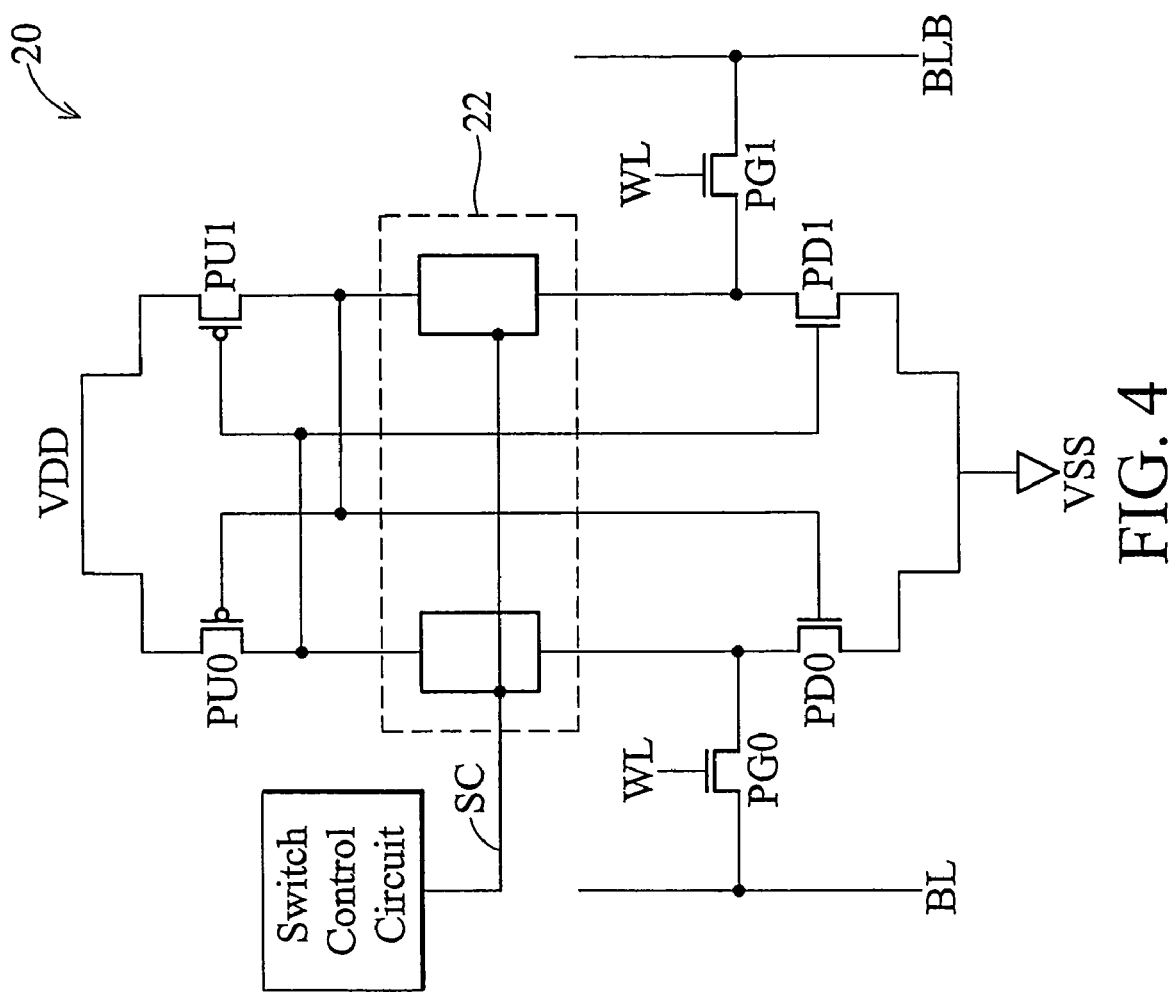
FIG. 4 illustrates a schematic diagram of a preferred embodiment.

The present invention provides a memory cell immune to static noise. FIG. 4 illustrates a schematic circuit diagram of a preferred embodiment, which includes a static random access memory (SRAM) cell 20. SRAM cell 20 preferably includes two load devices, load pull-up transistors PU0 and PU1, and four transistors, pull-down transistors PD0 and PD1 and pass-gate transistors PG0 and PG1. In the preferred embodiment, pull-up transistors PU0 and PU1 act as load devices. In other embodiments, resistors are used to replace pull-up transistors PU0 and PU1.

A switch-box 22 is formed between, and controls the electrical path between, the load devices and the pull-down transistors. A switch control circuit is preferably connected to switch control node SC to control the operation of switch-box 22. If switch-box 22 is turned on, the switches (symbolized by rectangles) in switch-box 22 are turned on, and the load devices and pull-down devices are connected. If, however, switch-box 22 is turn off, the switches in switch-box 22 are turned off, and the load devices and pull-down devices are electrically separated.

Figure 5:
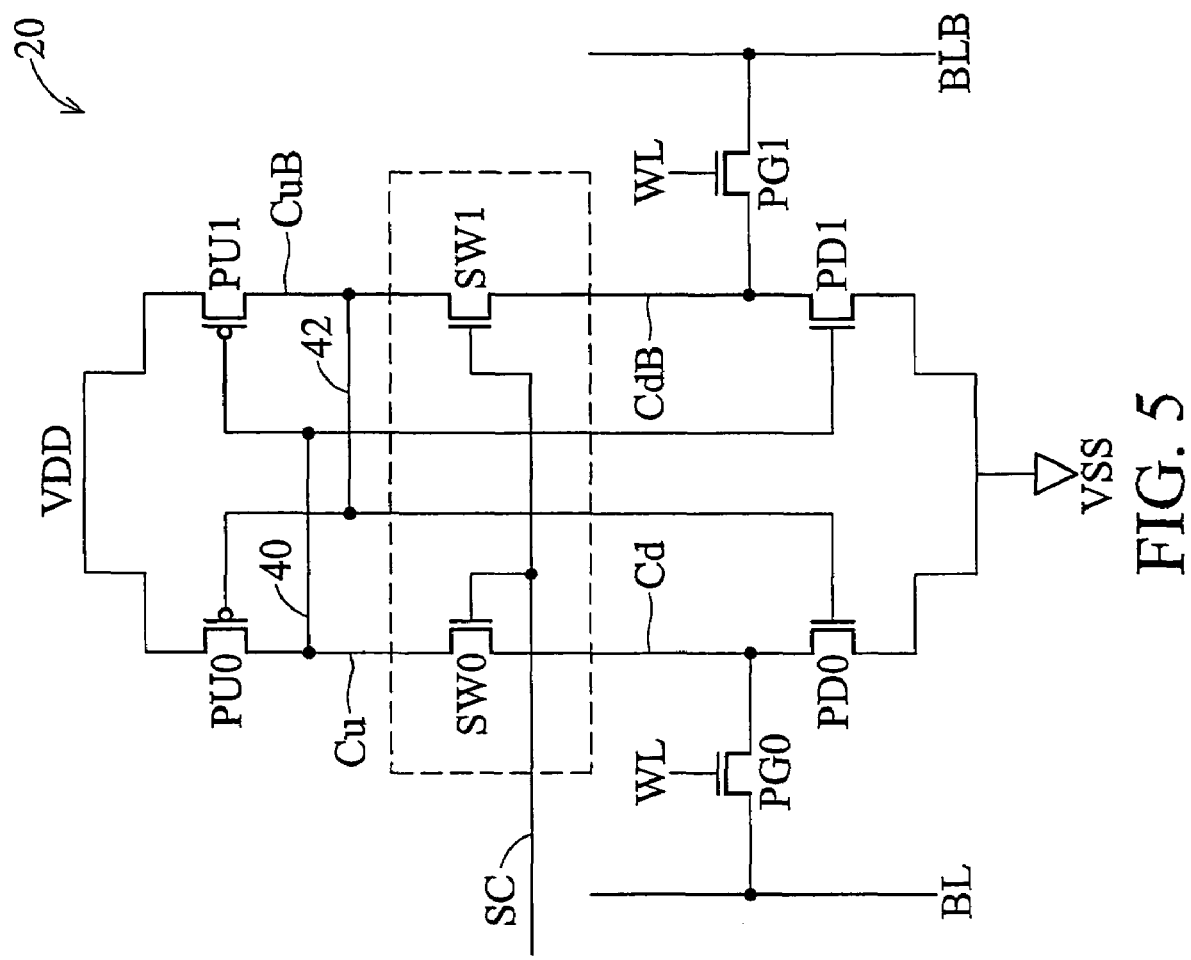
FIG. 5 illustrates a preferred embodiment, wherein a switch-box is formed of NMOS transistors.

FIG. 5 illustrates an exemplary embodiment of the circuit diagram shown in FIG. 4. The read operation and the write operation of the preferred embodiment are explained using the exemplary embodiment. In this embodiment, switch-box 22 includes two NMOS transistors SW0 and SW1 acting as switches, wherein switch SW0 is for connecting or disconnecting transistors PU0 and PD0, and switch SW1 is for connecting or disconnecting transistors PU1 and PD1.

Figure 6:
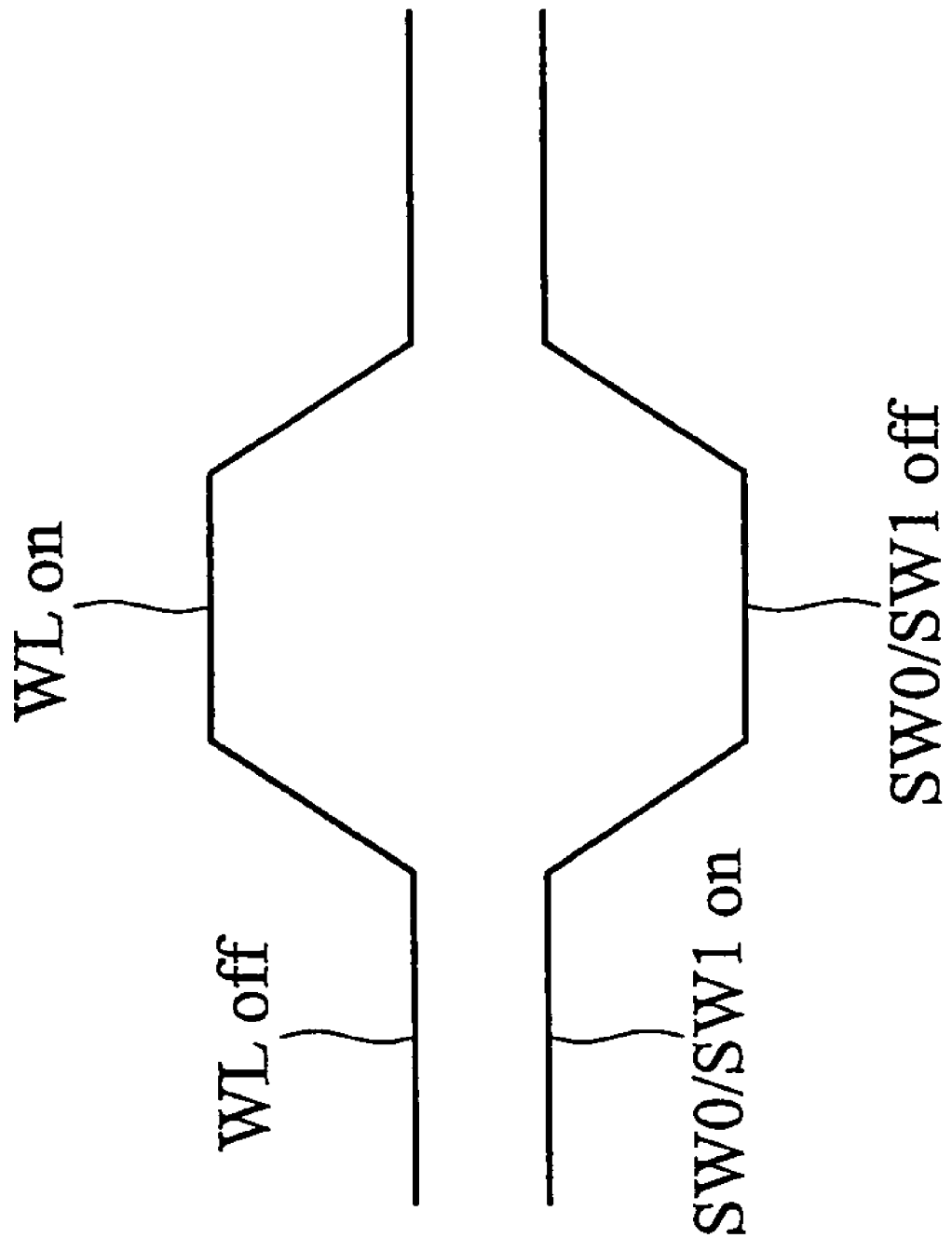
FIG. 6 illustrates schematic time sequences of the voltages on wordline WL and switch control node SC.

During a read operation of the SRAM cell, wordline WL is activated, and thus two pass-gate transistors PG0 and PG1 are turned on. Switches SW0 and SW1 are preferably turned off by a switch control signal on switch control node SC. FIG. 6 illustrates schematic time sequences of the voltages on wordline WL and switch control node SC. It is preferred that the transition of the switch control signal substantially follows the transition of the signal on wordline WL, although the switching of the switch control signal may be slightly ahead of or behind the switching of wordline WL. Preferably, switches SW0 and SW1 are only turned off for a short period of time, and are preferably turned on as soon as the read operation is finished.

Figure 7:
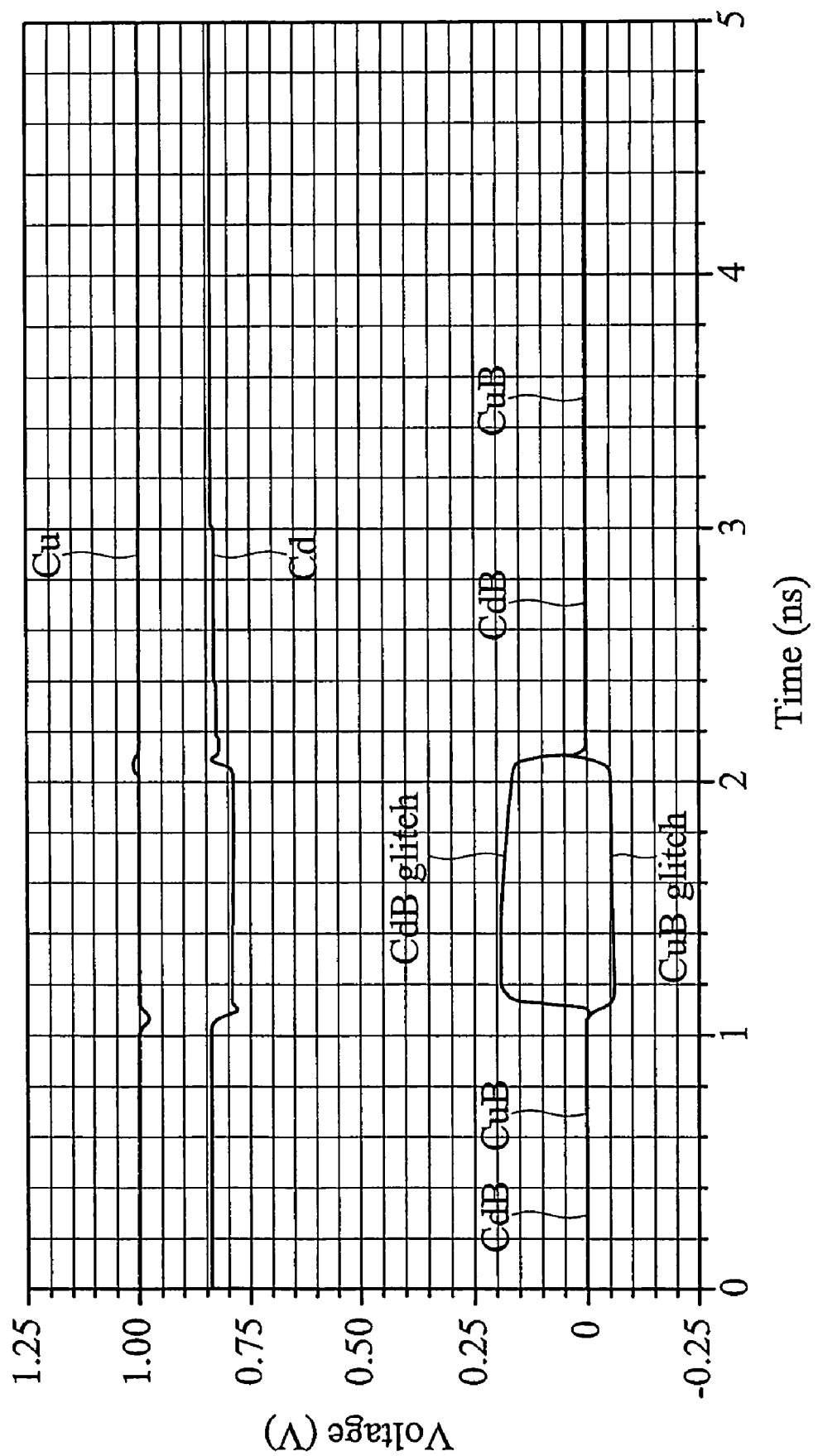
FIG. 7 illustrates simulated voltages on nodes of a preferred SRAM cell embodiment.

Referring back to FIG. 5, assuming that SRAM cell 20 stores a "1" prior to the read operation, nodes Cu and Cd are thus each at a high voltage, and nodes CuB and CdB are each at a low voltage. During the period of the read operation, the data "0" stored on node CdB will discharge bitline BLB to 0 through pass-gate transistor PG1, and thus the voltage on node CdB is determined by the voltage VSS and the pre-charged voltage on bitline BLB, as well as the equivalent resistances of transistors PG1 and PD1. The voltage on node CdB will accordingly have a glitch, as is shown in FIG. 7. However, the glitch will not cause a flip over of the entire SRAM cell. At the same time, voltages on nodes Cd, Cu and CuB stay substantially close to their respective states before the read operation, although small glitches may occur, depending on the time sequence of the voltage on switch control node SC with respect to the voltage on wordline WL. During the entire read operation, nodes Cu and Cd keep bitline BL at 1.

During the read operation, node CuB is electrically isolated from node CdB, and thus keeps a substantially undisturbed state "0." SRAM cell 20 can thus tolerate high static noise and device mismatch.

During an SRAM write operation, wordline WL is activated, and two pass-gate transistors PG0 and PG1 are turned on. Switches SW0 and SW1 are also turned on by a switch control signal on node SC. SRAM cell 20 will thus act as if switch-box 22 does not exist. Nodes CuB and CdB will be charged to VDD by the pre-charged bitline BLB through pass-gate transistor PG1. On the other hand, nodes Cu and Cd will be discharged to VSS by bitline BL through pass-gate transistor PG0. Thus new data is written into SRAM cell 20.

Figure 8:
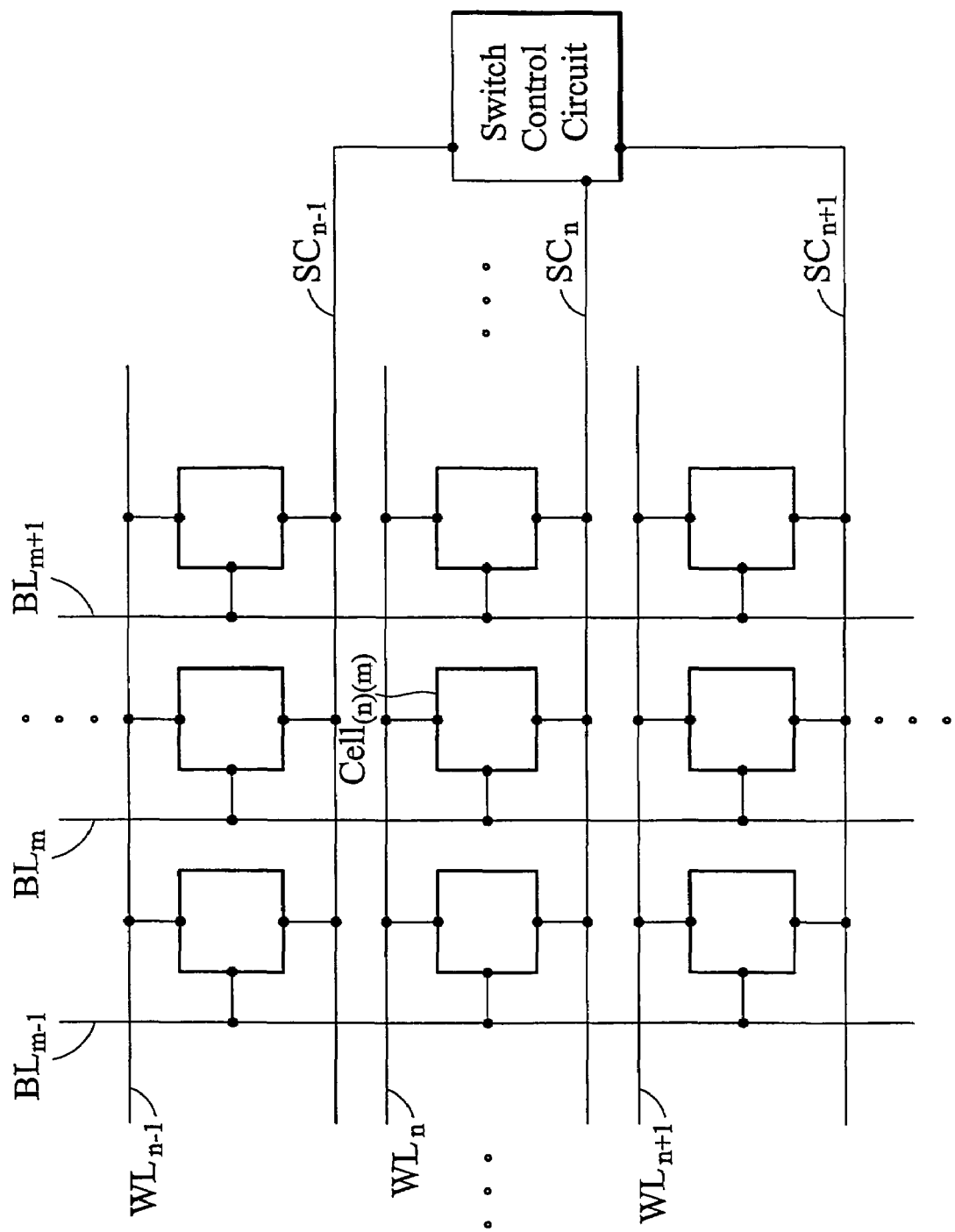
FIG. 8 illustrates an array formed of preferred SRAM cells.

The previously discussed SRAM cell embodiment may be used to form a memory array. FIG. 8 schematically illustrates an SRAM array comprising preferred SRAM cells. For simplicity purposes, only a three-by-three array is illustrated, wherein the rows are numbered as n−1, n, and n+1, and columns are numbered as m−1, m, and m+1. Each square symbolizes an SRAM cell, which is connected to a wordline WL, a bitline BL and a switch control line SC, wherein each of the lines are respectively numbered. Switch control lines SC are connected to a switch control circuit. In the preferred embodiment, SRAM cells connected to a same wordline are controlled by a same switch control line, such as $SC_{n-1}$, $SC_n$ and $SC_{n+1}$, as is illustrated in FIG. 8. In other embodiments, SRAM cells connected to a same bitline are controlled by a same switch control line. In yet other embodiment, each SRAM cell may be individually controlled by the switch control circuit. This may be achieved, for example, by connecting a first group of switch control lines to rows of the SRAM array, and a second group of switch control lines to columns of the SRAM array.

During a standby mode wherein no read operation and no write operation are performed, the switch-boxes (refer to FIG. 5) in SRAM cells are preferably all turned on, and thus the stored data are sustained.

During read operations, the switch-box in the SRAM cell being read is preferably turned off. The preferred states of the switch-boxes in the remaining cells are illustrated in tables 1 and 2, which only illustrate a three-by-three array corresponding to the SRAM cells shown in FIG. 8. It is to be realized, however, that the following tables are only exemplary settings for switch-boxes in the SRAM array, and thus should not be used to limit the scope of the present invention. Assuming only the SRAM cell having a row number n and a column m (denoted as $Cell_{(n)(m)}$ hereinafter) is being read, then the preferred switch-box states are as shown in Table 1.

TABLE 1

States of switch-boxes during read operations

|  | Bitline m − 1 | Bitline m | Bitline m + 1 |
|---|---|---|---|
| Wordline n − 1 | Off | Off | Off |
| Wordline n | Off | Off | Off |
| Wordline n + 1 | Off | Off | Off |

In the embodiment shown in Table 1, during the read operation of $Cell_{(n)(m)}$, all switch-boxes in the SRAM array are turned off even though only one SRAM cell is being read. After the read operation is performed, the switch-boxes are turned on.

Table 2 shows another preferred setting.

TABLE 2

States of switch-boxes during read operations

|  | Bitline m − 1 | Bitline m | Bitline m + 1 |
|---|---|---|---|
| Wordline n − 1 | On | On | On |
| Wordline n | Off | Off | Off |
| Wordline n + 1 | On | On | On |

Table 2 indicates that during the read operation of $Cell_{(n)(m)}$, all switch-boxes connected to a same wordline (same row n as in Table 2) $WL_n$ as $Cell_{(n)(m)}$ are turned off, while all other switch-boxes in the same memory array are turned on. After the read operation is performed, all the switch-boxes are turned on.

During write operations, the switch-box in the SRAM cell being read is preferably turned on. The preferred states of the switch-boxes in the remaining cells in the same array are illustrated in tables 3 and 4, which only illustrate a three-by-three array corresponding to the illustrated SRAM cells in FIG. 8. Assuming only the $Cell_{(n)(m)}$ is being written into, then the preferred switch-box states are:

TABLE 3

States of switch-boxes during write operations

|  | Bitline m − 1 | Bitline m | Bitline m + 1 |
|---|---|---|---|
| Wordline n − 1 | On | On | On |
| Wordline n | Off | On | Off |
| Wordline n + 1 | On | On | On |

In the embodiment shown in Table 3, during the write operation of $Cell_{(n)(m)}$, all switch-boxes connected to a same wordline (same row n as in Table 3) are turned off except $Cell_{(n)(m)}$, while all remaining switch-boxes in the same memory array are turned on. After the write operation is performed, all the switch-boxes in the SRAM array are turned on.

Table 4 illustrates another preferred embodiment of the switch-box states.

TABLE 4

States of switch-boxes during write operations

|  | Bitline m − 1 | Bitline m | Bitline m + 1 |
|---|---|---|---|
| Wordline n − 1 | Off | On | Off |
| Wordline n | Off | On | Off |
| Wordline n + 1 | Off | On | Off |

In the embodiment shown in Table 4, during the write operation, all other switch-boxes in the memory array are turned off except those SRAM cells connected to a same bitline as $Cell_{(n)(m)}$. After the read operation is performed, the switch-boxes are turned on.

Preferably, during the previously discussed read operations and write operations, the switch-boxes connected to a same wordline as the SRAM cell being read/written are preferably turned off also. One reason is that during read/write operations, SRAM cells in a same wordline as the cell being operated are dummy read, since their wordline (the same wordline as the cell being operated) is activated. Therefore, their switch-boxes are preferably turned off to prevent undesired state flip due to the dummy reads.

Figure 9:
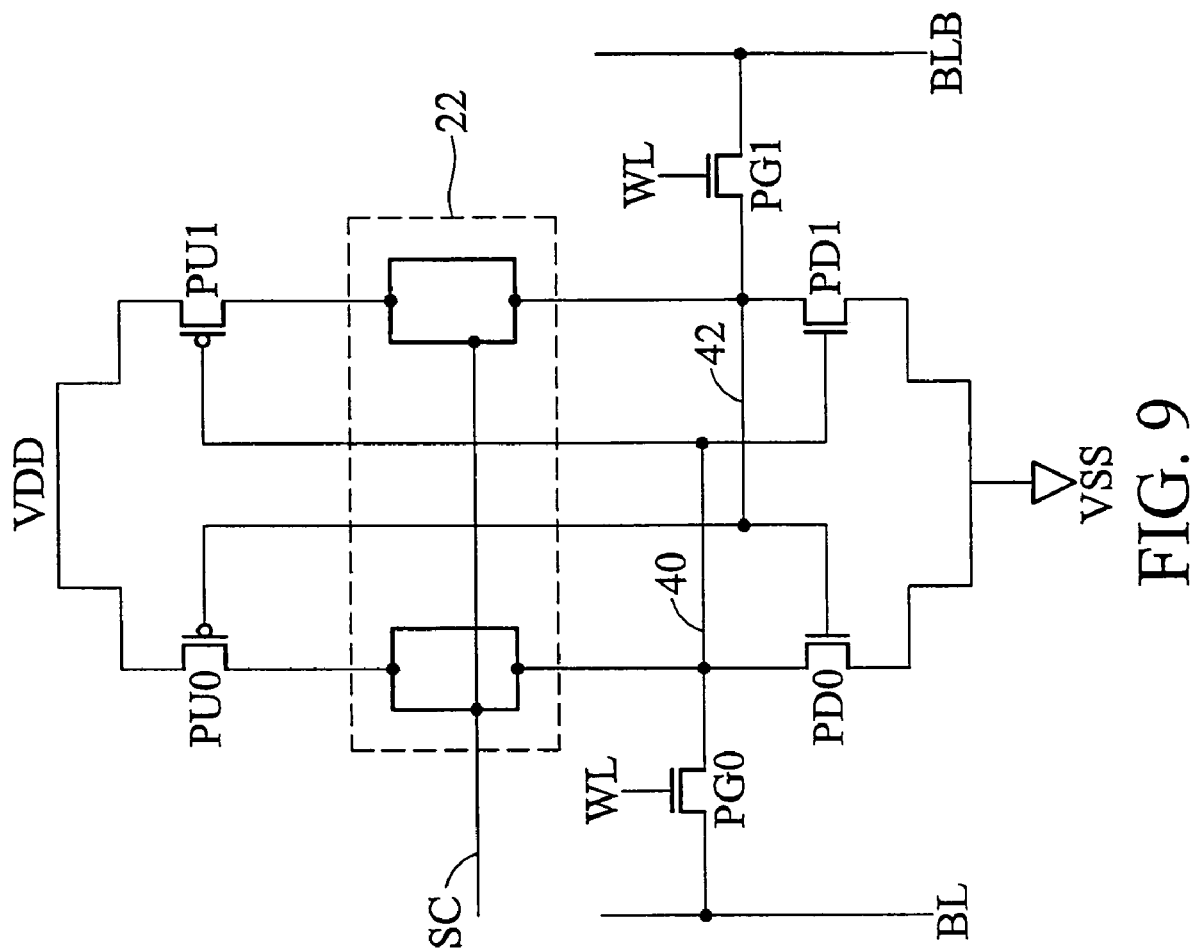
FIGS. 9 through 16 are schematic circuit diagrams of alternative embodiments of the present invention.
Figure 10:
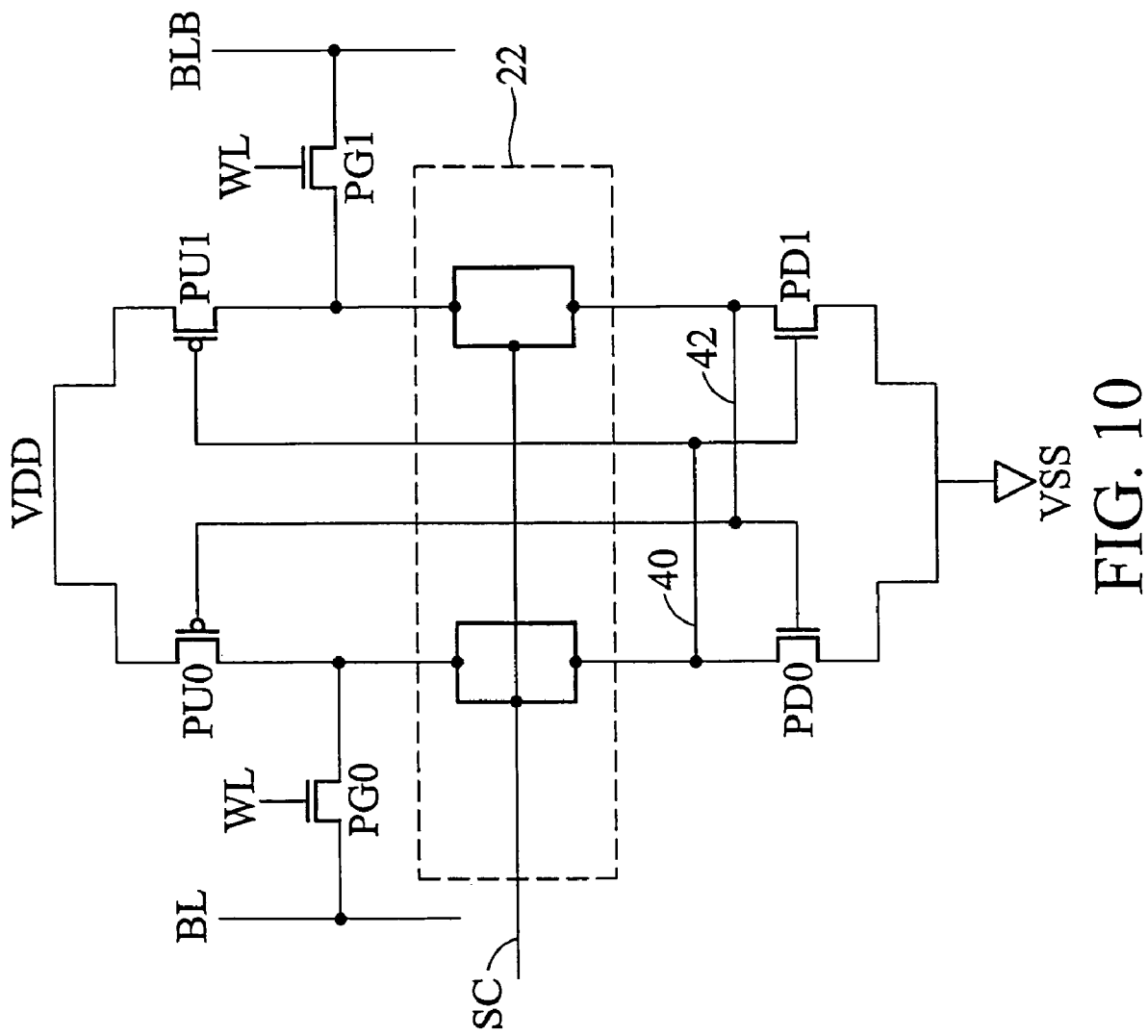
Figure 11:
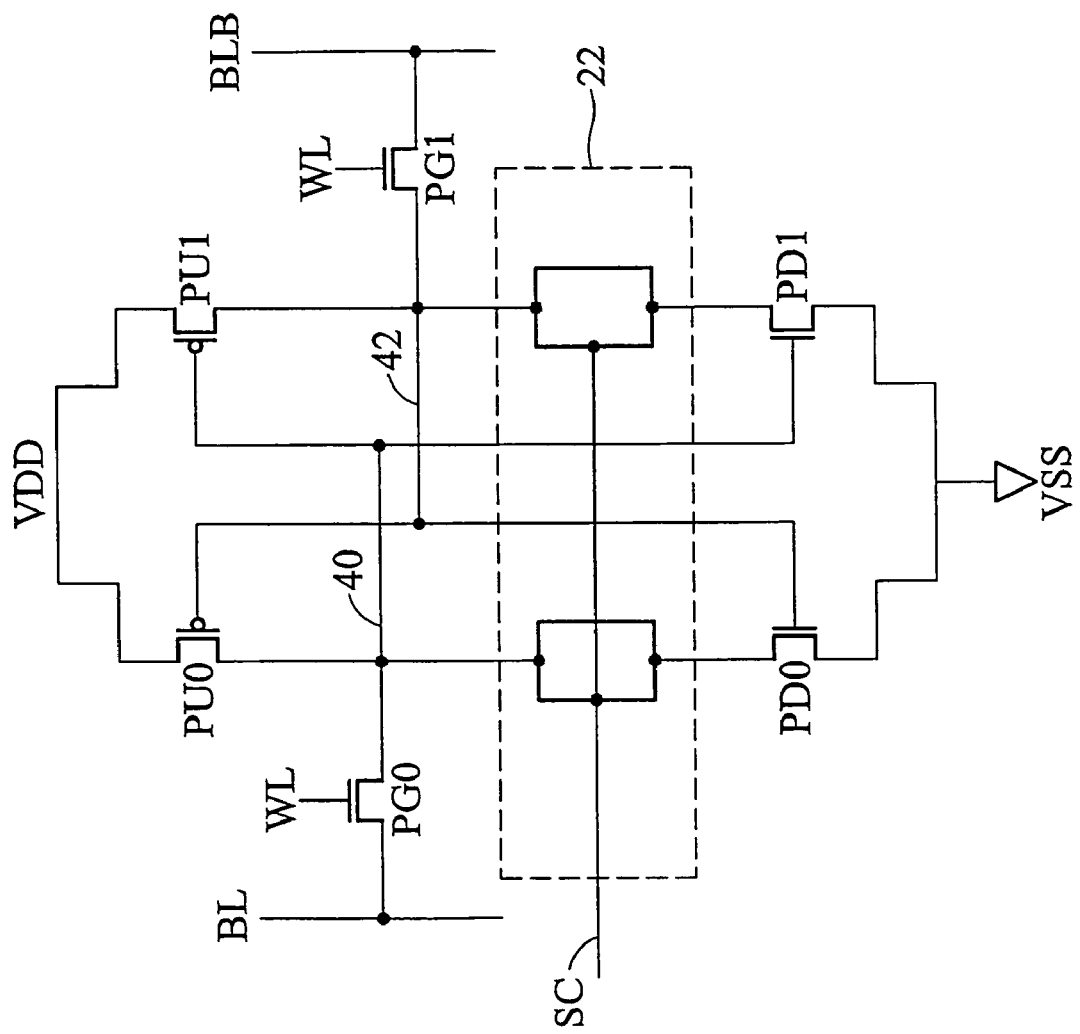
Figure 12:
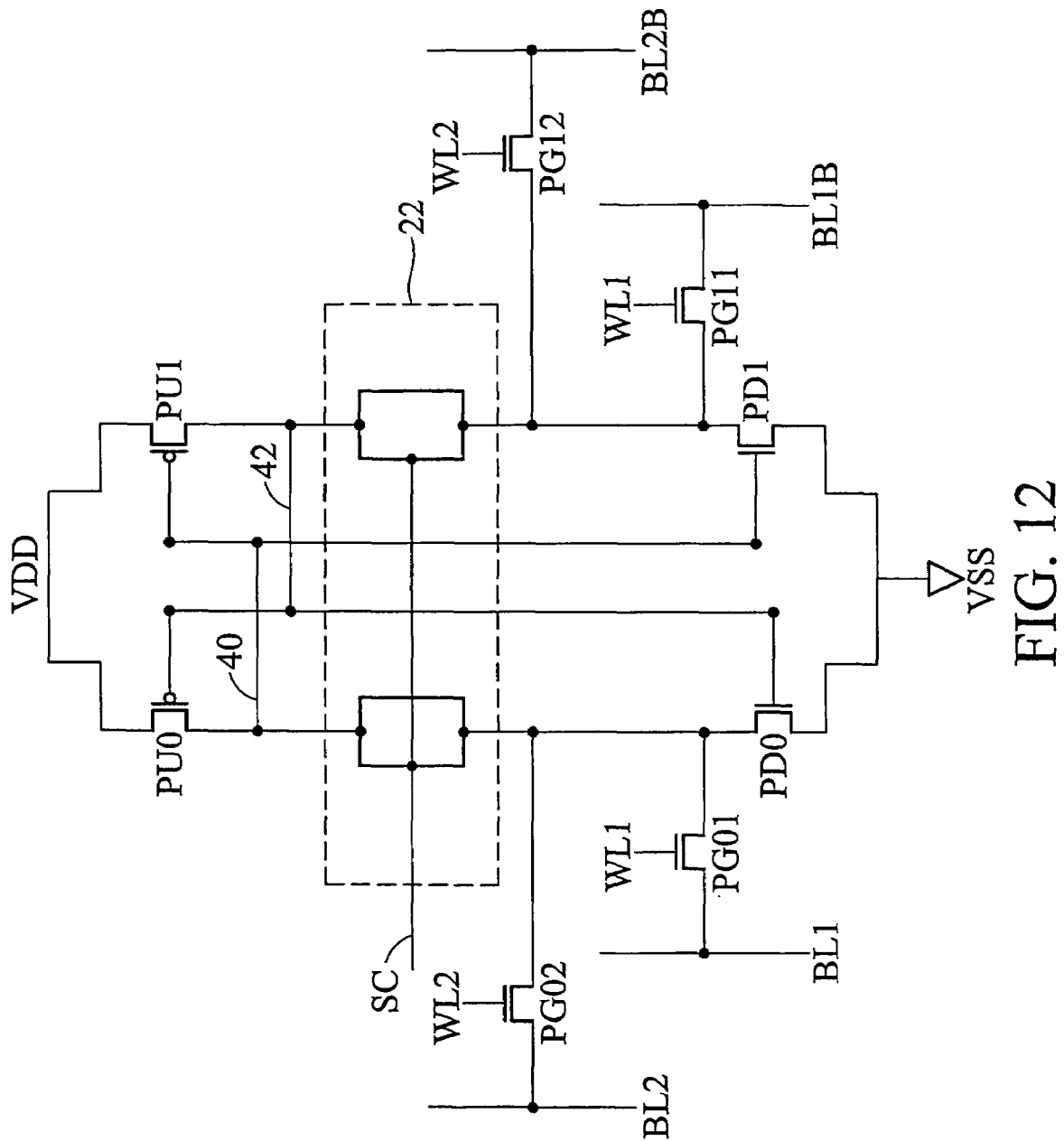
Figure 13:
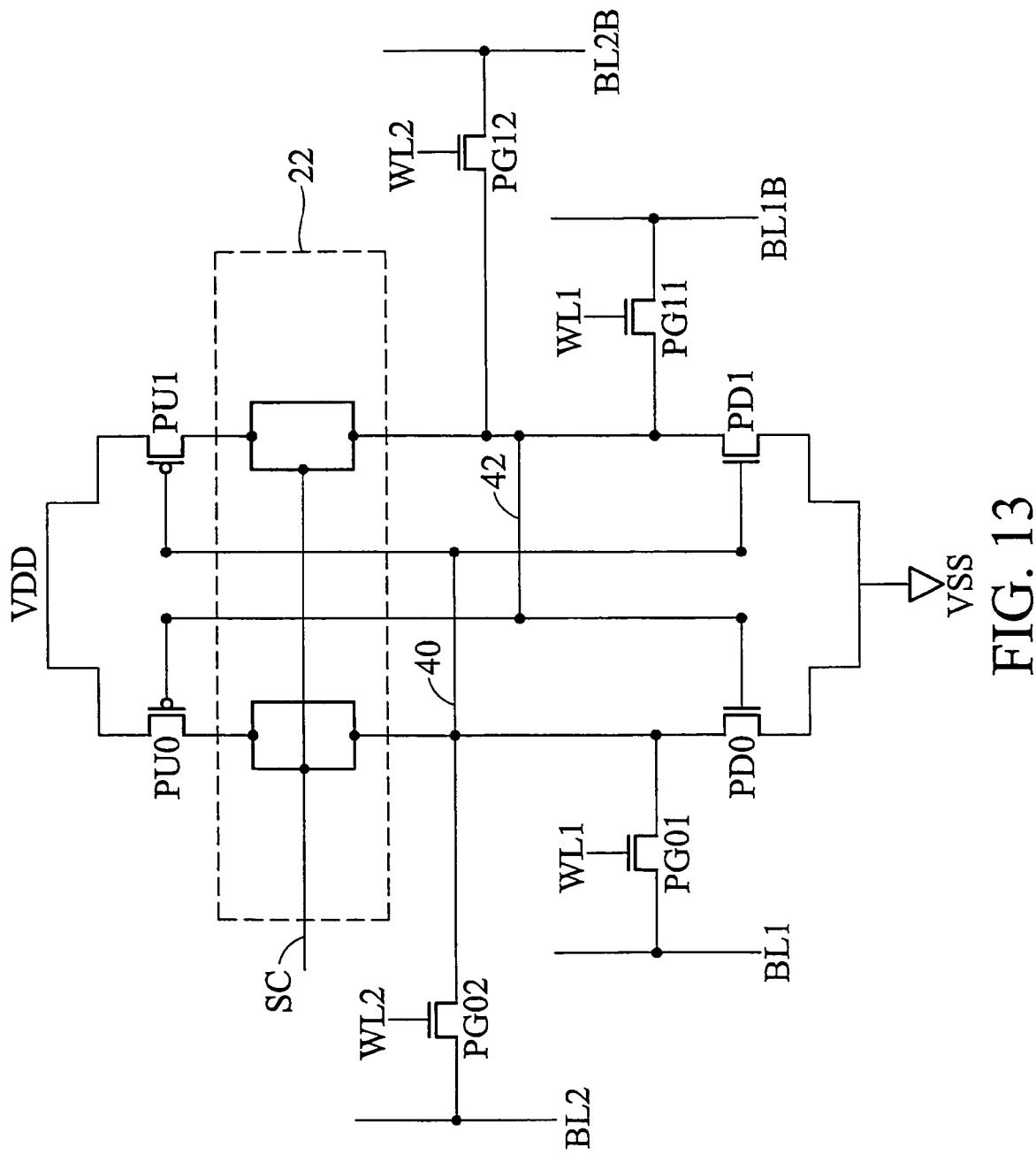
Figure 14:
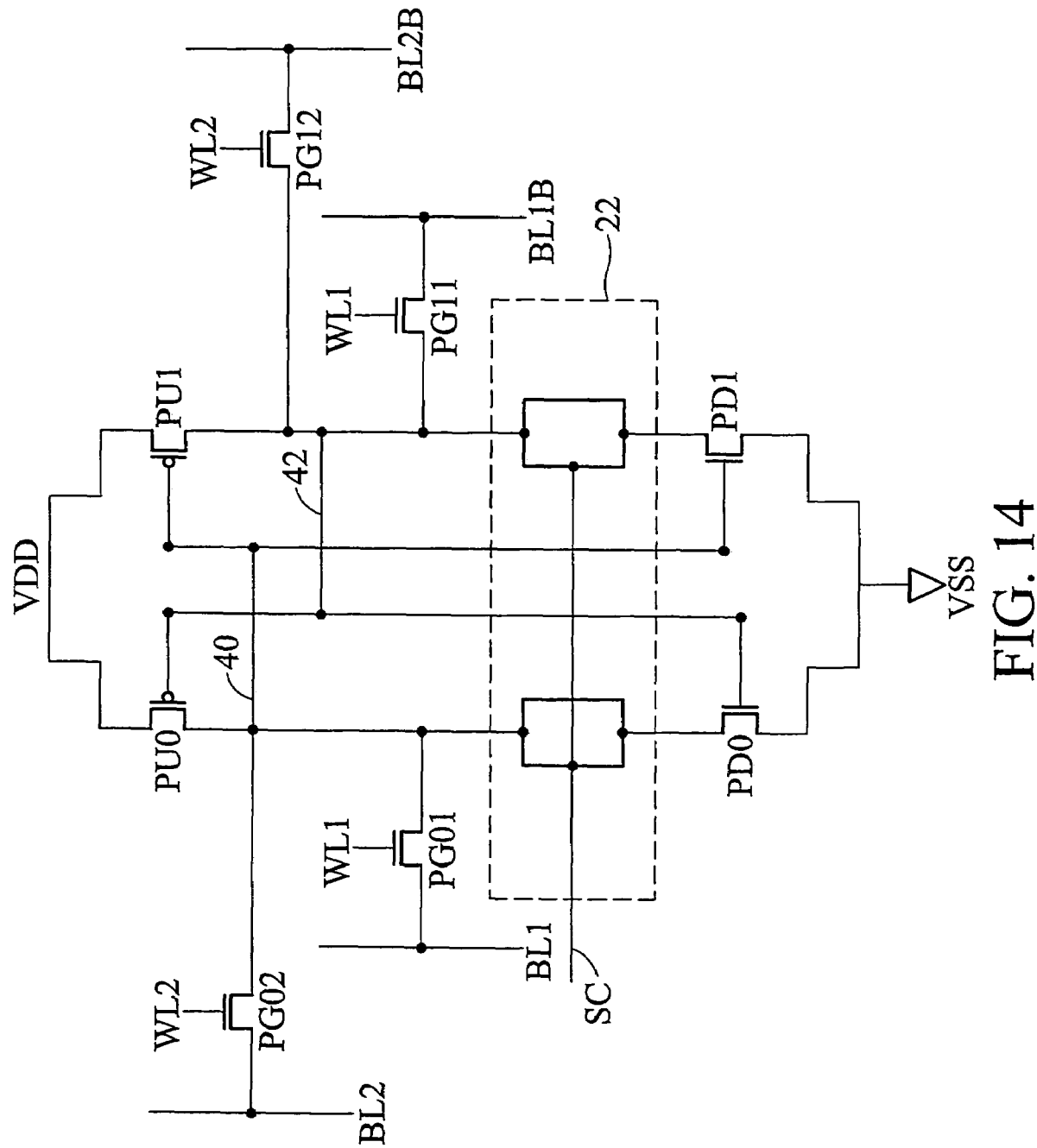
Figure 15:
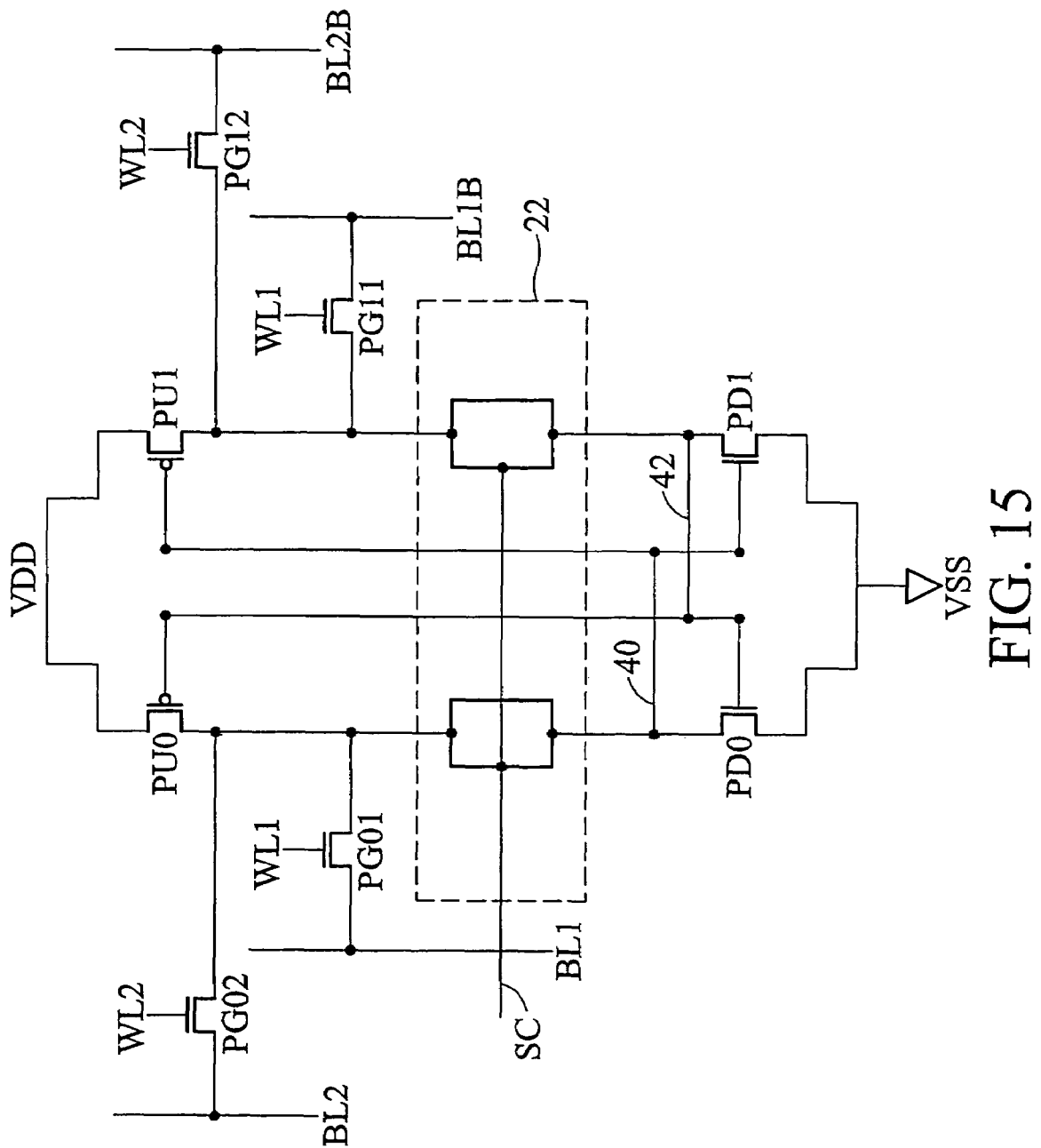

One skilled in the art will realize that by applying the teaching provided in the preceding paragraphs, various alternative embodiments can be implemented to achieve high static-noise tolerance. FIG. 9 illustrates one of the alternative embodiments, which is similar to the embodiment in FIG. 5, except that the connection lines 40 and 42 are on a same side of the switch-box 22 as pass-gate transistors PG0 and PG1. In FIG. 5, the corresponding connection lines 40 and 42 are on a different side from pass-gate transistors PG0 and PG1. In FIG. 10, pass-gate transistors PG0 and PG1 are on a same side of the switch-box 20 as load devices PU0 and PU1, while connection lines 40 and 42 are on a different side. In FIG. 11, connection lines 40 and 42 are formed on a same side of the switch-box 22 as the pass-gate transistors PG0 and PG1 and load devices PU0 and PU1.

FIGS. 12 through 15 illustrate eight transistor (8T) SRAM cell embodiments, wherein switch-boxes 22 act in a similar way as in 6T embodiments. In this embodiment, dynamic power can be provided to dual bitlines BL1 and BL2 (as well as BL1B and BL2B) to increase the read and/or write margins. Dual wordlines WL1 and WL2 are provided for selecting desired bitline voltages. Similarly, by moving the connection points of pass-gate transistors and/or connection lines 40 and 42 to either load device side or pull-down transistor side, different embodiments as shown in FIGS. 12 through 15 can be implemented. As is known in the art, commonly used SRAM cells also include 10T, 12T, 14T, etc., and one skilled in the art will realize the respective connections for the switch-box 22.

Figure 16:
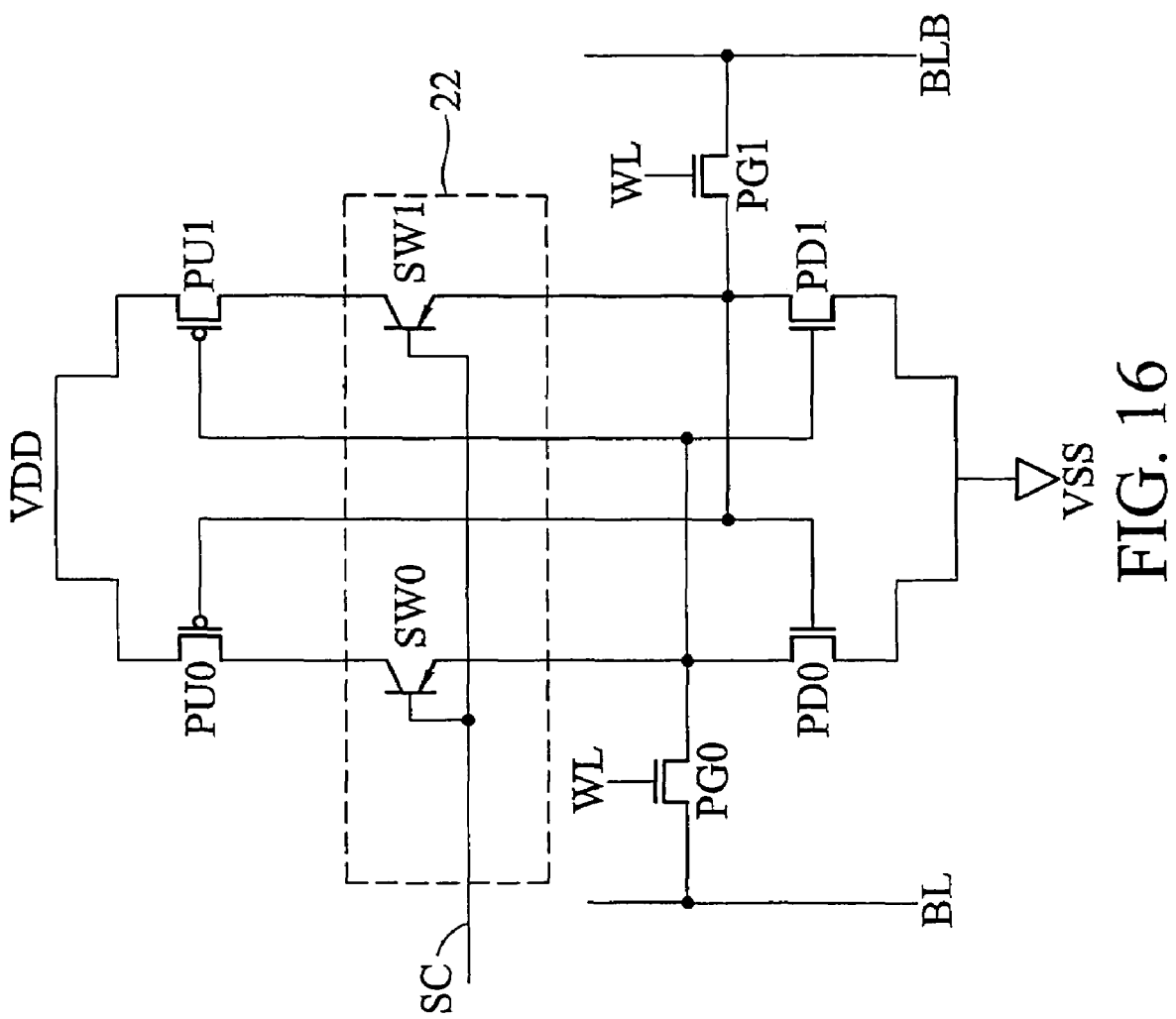

The switch-box 22 may also be formed by bipolar transistors. Furthermore, other MOS devices in the previously discussed embodiments, individually or in combination, may also be replaced with bipolar transistors. The replaceable transistors include, but are not limited to: transistors in switch-box 22, pass-gate transistors PG0 and PG1 and pull-down transistors PD0 PD1. FIG. 16 illustrates an exemplary embodiment wherein the switches SW0 and SW1 are formed of bipolar transistors. In addition, in the previously discussed embodiments, the switch transistors SW0 and SW1 and pass-gate transistors PG0 and PG1 are NMOS transistors, but one skilled in the art will realize that PMOS transistors can also be used.

Although the switch-box 22 (refer to FIG. 5) occupies chip area, such a chip area cost can be compensated for. Since the preferred embodiments of the present invention have an improved read margin, the beta ratio of the SRAM cell can be smaller without causing read errors, wherein beta ratio is the ratio of the drive current of pull-down transistors to the drive current of pass-gate transistors. As a result, the pull-down devices can be made smaller, for example, having a small channel width-to-length ratio. The chip area cost is thus compensated for. Another benefit of the preferred embodiments is that with the decrease of the beta ratio, the write margin is improved, resulting in easier flips of states during write operations.

The preferred embodiments of the present invention have several advantageous features. SRAM cells formed using the preferred embodiments are immune to static noise, and can tolerate higher noise and higher device mismatch. Due to the improvement in noise toleration, the SRAM cells can be used for very small-scale technologies, for example, 90 nm and below. Operation voltage can also be decreased.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An SRAM array comprising:
   an array of SRAM cells arranged in a plurality of rows and a plurality of columns, wherein each of the SRAM cells comprises:
   a load device;
   a pull-down transistor; and
   a switch-box coupled between the load device and the pull-down transistor;
   a plurality of wordlines connected to the rows of SRAM cells of the array with a wordline connected to SRAM cells in a same row;
   a plurality of bitlines connected to the columns of SRAM cells of the array with a bitline connected to SRAM cells in a same column;
   a plurality of switch control lines connected to switch-boxes of the SRAM cells, wherein the plurality of switch control lines comprises:
   a first group of switch control lines connected to the rows of SRAM cells of the array with a switch control line connected to SRAM cells in a same row; and
   a second group of switch control lines connected to the columns of SRAM cells of the array with a switch control line connected to SRAM cells in a same column; and
   a switch control circuit connected to the plurality of switch control lines and configured to:
   turn off a switch-box of an SRAM cell during a read operation of the SRAM cell, and turn on the switch-box during a write operation of the SRAM cell;
   turn off switch-boxes of SRAM cells connected to a same wordline as the SRAM cell when the read operation is performed on the SRAM cell; and
   when the read operation is performed on the SRAM cell, turn off all switch-boxes of SRAM cells of the array not connected to the same wordline as the SRAM cell.

2. The SRAM array of claim 1, wherein, when the write operation is performed on the SRAM cell, the switch control circuit is configured to turn on all switch-boxes of SRAM cells not connected to the same wordline as the SRAM cell, and to turn off all switch-boxes of all remaining SRAM cells connected to the same wordline as the SRAM cell.

3. The SRAM array of claim 1, wherein, when the write operation is performed on the SRAM cell, the switch control circuit is configured to turn on all switch-boxes of SRAM cells in a same column as the SRAM cell, and to turn off all switch-boxes of all remaining SRAM cells.

4. The SRAM array of claim 1, wherein the load device is a resistor.

5. The SRAM array of claim 1, wherein the switch-box comprises bipolar transistors.

6. The SRAM array of claim 1 further comprising a pass-gate device coupled to at least one of the load device and the pull-down transistor, wherein the pass-gate device is selected from a group consisting of a MOS transistor and a bipolar transistor.

7. An SRAM array comprising:
   an array of SRAM cells arranged in a plurality of rows and a plurality of columns, wherein each of the SRAM cells comprises:
   a load device;
   a pull-down transistor; and
   a switch-box coupled between the load device and the pull-down transistor;
   a plurality of wordlines connected to the rows of SRAM cells of the array with a wordline connected to SRAM cells in a same row;
   a plurality of bitlines connected to the columns of SRAM cells of the array with a bitline connected to SRAM cells in a same column;
   a plurality of switch control lines connected to switch-boxes of the SRAM cells, wherein the plurality of switch control lines comprises:
   a first group of switch control lines connected to the rows of SRAM cells of the array with a switch control line connected to SRAM cells in a same row; and
   a second group of switch control lines connected to the columns of SRAM cells of the array with a switch control line connected to SRAM cells in a same column; and
   a switch control circuit connected to the plurality of switch control lines and configured to:
   turn off a switch-box of an SRAM cell during a read operation of the SRAM cell, and turn on the switch-box during a write operation of the SRAM cell;
   turn off switch-boxes of SRAM cells connected to a same wordline as the SRAM cell when the read operation is performed on the SRAM cell; and
   when the write operation is performed on the SRAM cell, turn on all switch-boxes of SRAM cells not connected to the same wordline as the SRAM cell, and to turn off all switch-boxes of all remaining SRAM cells connected to the same wordline as the SRAM cell.

8. The SRAM array of claim 7, wherein the switch control circuit is further configured to turn off switch-boxes of SRAM cells connected to the same wordline as the SRAM cell when the read operation is performed on the SRAM cell.

9. The SRAM array of claim 7, wherein when the read operation is performed on the SRAM cell, the switch control circuit is configured to turn on all switch-boxes of SRAM cells of the array not connected to the same wordline as the SRAM cell.

10. The SRAM array of claim 7, wherein when the read operation is performed on the SRAM cell, the switch control circuit is configured to turn off all switch-boxes of SRAM cells of the array not connected to the same wordline as the SRAM cell.

11. The SRAM array of claim 7, wherein the load device is a resistor.

12. The SRAM array of claim 7, wherein the switch-box comprises bipolar transistors.

13. An SRAM array comprising:
an array of SRAM cells arranged in a plurality of rows and a plurality of columns, wherein each of the SRAM cells comprises:
a load device;
a pull-down transistor; and
a switch-box coupled between the load device and the pull-down transistor;
a plurality of wordlines connected to the rows of SRAM cells of the array with a wordline connected to SRAM cells in a same row;
a plurality of bitlines connected to the columns of SRAM cells of the array with a bitline connected to SRAM cells in a same column;
a plurality of switch control lines connected to switch-boxes of the SRAM cells, wherein the plurality of switch control lines comprises:
a first group of switch control lines connected to the rows of SRAM cells of the array with a switch control line connected to SRAM cells in a same row; and
a second group of switch control lines connected to the columns of SRAM cells of the array with a switch control line connected to SRAM cells in a same column; and
a switch control circuit connected to the plurality of switch control lines and configured to:
turn off a switch-box of an SRAM cell during a read operation of the SRAM cell, and turn on the switch-box during a write operation of the SRAM cell;
turn off switch-boxes of SRAM cells connected to a same wordline as the SRAM cell when the read operation is performed on the SRAM cell; and
when the write operation is performed on the SRAM cell, turn on all switch-boxes of SRAM cells in a same column as the SRAM cell, and turn off all switch-boxes of all remaining SRAM cells.

14. The SRAM array of claim 13, wherein the switch control circuit is further configured to turn off switch-boxes of SRAM cells connected to the same wordline as the SRAM cell when the read operation is performed on the SRAM cell.

15. The SRAM array of claim 13, wherein, when the read operation is performed on the SRAM cell, the switch control circuit is configured to turn on all switch-boxes of SRAM cells of the array not connected to the same wordline as the SRAM cell.

16. The SRAM array of claim 13, wherein, when the read operation is performed on the SRAM cell, the switch control circuit is configured to turn off all switch-boxes of SRAM cells of the array not connected to the same wordline as the SRAM cell.

* * * * *